(12) United States Patent
Heo

(10) Patent No.: US 8,199,588 B2
(45) Date of Patent: *Jun. 12, 2012

(54) SEMICONDUCTOR MEMORY DEVICE WITH A DATA OUTPUT CIRCUIT CONFIGURED TO OUTPUT STORED DATA DURING A FIRST TYPE OF READ OPERATION AND CONFIGURED TO OUTPUT AT LEAST ONE DATA PATTERN DURING A SECOND TYPE OF READ OPERATION AND METHODS THEREOF

(75) Inventor: Nak-Won Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

This patent is subject to a terminal disclaimer.

(21) Appl. No.: 12/453,413

(22) Filed: May 11, 2009

(65) Prior Publication Data
US 2009/0244986 A1    Oct. 1, 2009

Related U.S. Application Data

(63) Continuation of application No. 11/589,179, filed on Oct. 30, 2006, now Pat. No. 7,551,495.

(30) Foreign Application Priority Data

Jan. 19, 2006 (KR) .................. 10-2006-0005953

(51) Int. Cl.
*G11C 7/00* (2006.01)
(52) U.S. Cl. .............. 365/189.05; 365/149; 365/189.12; 365/233.1

(58) Field of Classification Search .................. 365/149, 365/189.05, 189.12, 233.1
See application file for complete search history.

(56) References Cited

U.S. PATENT DOCUMENTS 7,551,495 B2 *   6/2009   Heo .......................... 365/189.05

FOREIGN PATENT DOCUMENTS

| JP | 2001-297598 | 10/2001 |
| JP | 2002-025255 | 1/2002 |
| JP | 2002-109888 | 4/2002 |
| KR | 100200923 | 3/1999 |
| KR | 10-2000-0056166 | 9/2000 |
| KR | 10-2001-0037848 | 5/2001 |
| KR | 10-2003-0002161 | 1/2003 |
| KR | 10-2003-0034467 | 5/2003 |
| KR | 10-2005-0085785 | 8/2005 |

OTHER PUBLICATIONS

"JDEC Standard: DDR 3 SDRAM Standard, JESD79-3D (Revision of JESD79-3C, Nov. 2008)." JEDEC Solid State Technology Association, Sep. 2009.

* cited by examiner

*Primary Examiner* — Hoai V Ho
(74) *Attorney, Agent, or Firm* — Harness, Dickey & Pierce, P.L.C.

(57) ABSTRACT

According to example embodiments, a semiconductor memory device includes a memory cell array, a multi-purpose register, a data output circuit, and a mode register. The memory cell array is configured to store data. The multi-purpose register is configured to store a data pattern. The data output circuit is configured to output the stored data during a first output mode and output the stored data pattern during a second output mode. The mode register is configured to set the first or second output mode according to a logic level of a portion of a content of the mode register.

17 Claims, 3 Drawing Sheets

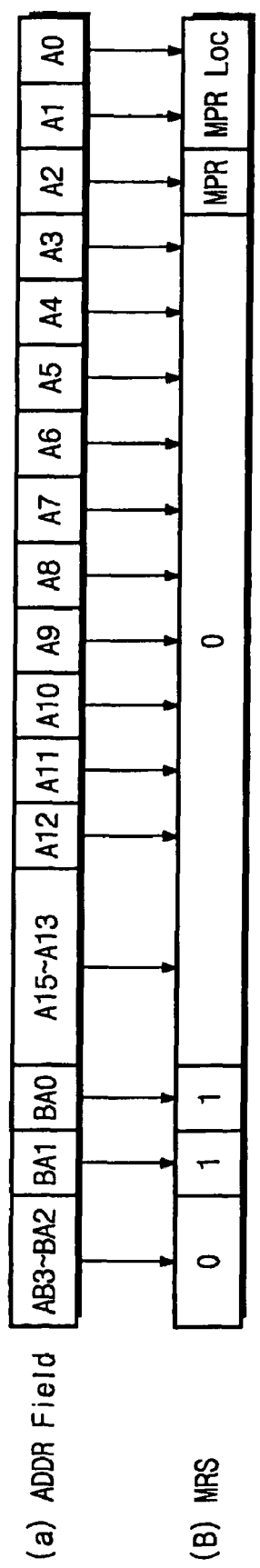

SEMICONDUCTOR MEMORY DEVICE WITH A DATA OUTPUT CIRCUIT CONFIGURED TO OUTPUT STORED DATA DURING A FIRST TYPE OF READ OPERATION AND CONFIGURED TO OUTPUT AT LEAST ONE DATA PATTERN DURING A SECOND TYPE OF READ OPERATION AND METHODS THEREOF

PRIORITY STATEMENT

This U.S. non-provisional application is a continuation of application Ser. No. 11/589,179 filed on Oct. 30, 2006, now U.S. Pat. No. 7,551,495, and from which priority is claimed under 35 U.S.C. §120. This application also claims benefit of priority under 35 U.S.C. §119 from Korean Patent Application No. 10-2006-0005953 filed on Jan. 19, 2006, in the Korean Intellectual Property Office. The entire contents of both of these applications are incorporated herein by reference.

BACKGROUND

1. Field of the Invention

Example embodiments of the present invention relate generally to a semiconductor memory device and methods thereof, and more particularly to a semiconductor memory device and methods of reading data from the semiconductor memory device.

2. Description of the Related Art

A synchronous dynamic random access memory (DRAM) (SDRAM) may conform with standards developed by the Joint Electron Device Engineering Circuit (JDEC). Typically, SDRAMs may be characterized by having 1) input/output (I/O) circuit synchronized with an external clock, 2) burst access, 3) multi-bank configuration, 4) command-type access, and 5) data path using pipeline technique, which are described below in greater detail.

With regard to I/O circuit synchronization, SDRAM may establish various timing parameters in multiples of a clock cycle in order to input and output signals in synchronization with an external clock. Because a control signal applied during a single clock cycle may be stored in an internal register, a received state may be maintained until the contents of the internal register are changed. A control signal (e.g., different from the clock signal) may be received in order to change the received state. For example, two or more control signals may be provided and an operating state of the SDRAM may be determined based on a status of each of the control signals. The state may be decoded by a command decoder in the SDRAM, such that other operations of the SDRAM may be performed. Accordingly, adjusting the state or start-point of an operation may be considered as a type of programming, typically referred to as a command.

With regard to burst access, a burst may generally refer to any phenomenon with a relatively high intensity and a relatively short duration. As used herein, the burst access may indicate that data input/output of a memory may be successively performed in synchronization with a clock. If an active command ACT_CMD and a row address are received at a rising edge of a clock, a memory may transition to an activated state (e.g., a first logic level, such as a higher logic level or logic "1") and a word line may be selected by the row address. If a read command and a column address are received at the following clock, a burst operation may be carried out. Thus, a column address may be increased or incremented after a given number of clock cycles, and data may be successively or consecutively outputted.

A bank may include a plurality of memory cells that may operate independently in order to achieve a higher-speed operation via interleaving in a memory module. Memory cells in one bank may typically share both a data bus as well as address and control signal lines in common, and may operate independently with respect to another bank (e.g., each bank may have its own connection buses). Accordingly, while a data read operation may be performed with respect to a first bank, a precharge or refresh operation may be performed with respect to a second bank or a word line selecting operation may be carried out by a row address.

A pipeline may refer to a concurrent data handling structure or process wherein a data path may be divided using flip-flops or latches and a plurality of circuit blocks may be operated concurrently. That is, a data path may be divided into a plurality of independent circuit blocks by disposing two or more flip-flops or latches on the data path. Read data may be latched by one circuit block, and the latched data may be outputted to an external entity via another path. Concurrently, a new address may be received through another path or a precharge operation may be carried out.

Double Data Rate (DDR) SDRAM may input and output data or commands at both rising and falling edges of a clock. Accordingly, in an example, a data rate corresponding to a clock of 200 MHz (e.g., of a single data rate (SDR) SDRAM) may be achieved using a clock of 100 MHz. To achieve such a result, the clock signal may be set to have a duty of 50%.

The DDR SDRAM may be classified as one of DDR1 SDRAM, DDR2 SDRAM, DDR3 SRAM, etc. The DDR1 SRAM may utilize a 2-bit pre-fetch manner at input/output and may have a data burst length of 2. The DDR2 SRAM may utilize a 4-bit pre-fetch manner at input/output and may have a data burst length of 4. The DDR3 SRAM may utilize an 8-bit pre-fetch manner at input/output and may have a data burst length of 8. Herein, if a burst length is 8, then eight data may be successively inputted and outputted via one input/output terminal in synchronization with a single clock, and so on.

The DDR3 SDRAM may support a read leveling operation, which may refer to adjusting a DQS skew between a chipset and a memory chip by transferring data patterns set in a register of the memory chip to the chipset. An operation for reading the data patterns in the register may be carried out irrespective of whether normal data is stored in memory cells. Such an operation may be referred to as a "special" read operation, in contrast to a "normal" read operation.

As set forth above, the SDRAM may include data patterns read irrespective of whether normal data is stored in memory cells. The special read operation may typically be performed in order to read these data patterns. The special read operation may be said to be "indifferent" to the presence of normal data. However, data access operations such as a word line enable operation, a bit line precharge operation, may still be performed during special read operations, which may increase a duration of special read operations as well as a power consumption of the special read operations.

SUMMARY

An example embodiment of the present invention is directed to a semiconductor memory device, including a memory cell configured to store data, a storage unit configured to store at least one data pattern, a data output circuit configured to output the stored data during a first type of read operation and configured to output the at least one data pattern during a second type of read operation and an output control circuit for controlling the data output circuit such that the memory cell is not accessed during read operations of the second type.

Another example embodiment of the present invention is directed to a method of reading data from a semiconductor memory device, including storing data in a memory cell, storing at least one data pattern in a storage unit, outputting the stored data within the memory cell in response to a first type of read operation and outputting the at least one data pattern in the storage unit in response to a second type of read operation and blocking access to the memory cell during read operations of the second type.

Another example embodiment of the present invention is directed to a method of reading data from a semiconductor memory device, including storing at least one fixed data pattern within a storage unit, the at least one fixed data pattern only accessible during read operations of a first type, storing normal data within at least one memory cell, the normal data only accessible during read operations of a second type and blocking access to the at least one memory cell during an execution of read operations of the second type.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 2 is a conceptual diagram illustrating a mode register according to another example embodiment of the present invention.

FIG. 3 illustrates operating modes for the semiconductor memory device of FIG. 1 based on a mode register set according to another example embodiment of the present invention.

DETAILED DESCRIPTION OF EXAMPLE EMBODIMENTS

Figure 1:
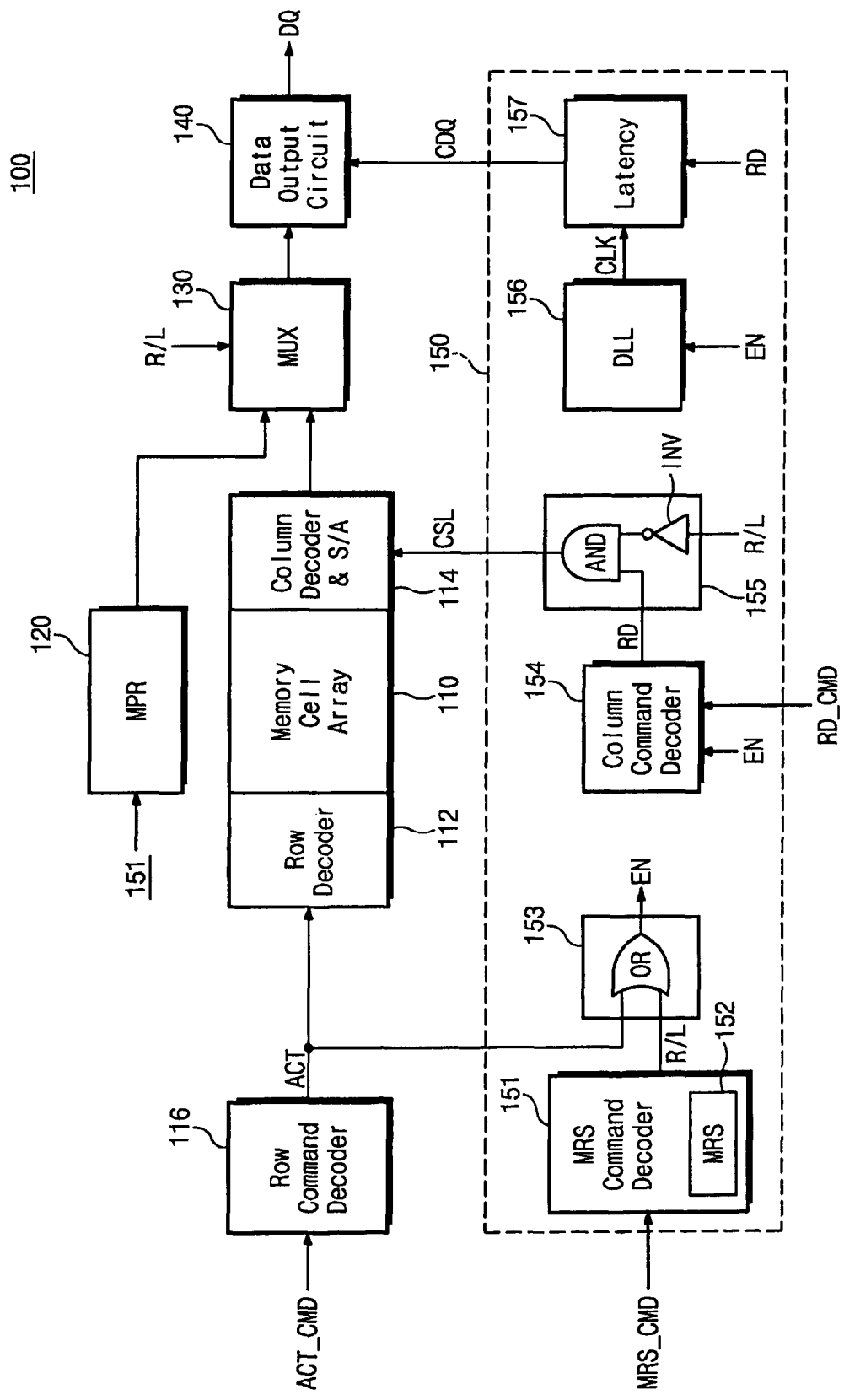
FIG. 1 is a block diagram illustrating a semiconductor memory device according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device 100 according to an example embodiment of the present invention. In the example embodiment of FIG. 1, the semiconductor memory device 100 may include a memory cell array 110, a multi-purpose register 120, a selection circuit 130, a data output circuit 140, and an output control circuit 150. The semiconductor memory device 100 may further include a row decoder 112, a column decoder and sense amplifier circuit 114 and a row command decoder 116.

In the example embodiment of FIG. 1, the memory cell array 110 may include a plurality of memory cells (not shown). In an example, one or more of the plurality of memory cells may be embodied as a DRAM cell including an NMOS transistor and a capacitor. Each of the plurality of memory cells may store "normal" data, which may be output in response to a "normal" read operation.

In the example embodiment of FIG. 1, the row decoder 112 may drive a selected word line in response to an active signal ACT, during a normal read operation. The column decoder and sense amplifier circuit 114 may sense and amplify a voltage level of a selected bit line in response to a read signal RD. The row command decoder 116 may decode an active command ACT_CMD to generate the active signal ACT, during a normal read operation. In an example, the active command ACT_CMD may be decoded by a combination of control signals, including but not limited to a chip selection signal nCS, a row address strobe signal nRAS, a column address strobe signal nCAS, a write enable signal nWE, etc. For example, the row command decoder 116 may generate the active signal ACT if the chip selection signal nCS is set to a second logic level (e.g., a lower logic level or logic "0"), the row address strobe signal nRAS is set to the second logic level, the column address strobe signal nCAS is set to the first logic level (e.g., a higher logic level or logic "1") and the write enable signal nWE is set to the first logic level.

In the example embodiment of FIG. 1, the multi-purpose register 120 may store a plurality of data patterns. In an example, each of the plurality of data patterns may be fixed (e.g., read-only). The multi-purpose register 120 may be controlled by a mode register and may have various functionality. For example, in case of DDR3 SDRAM, the multi-purpose register 120 may be used to perform a read leveling operation. Herein, the read leveling operation refer to an operation for adjusting a DQS skew between a chipset (not shown) and a memory chip by transferring one or more of the stored plurality of data patterns in the multi-purpose register 120 to the chipset. The multi-purpose register 120 will be described in greater detail below with reference to FIGS. 2 and 3.

In the example embodiment of FIG. 1, the selection circuit 130 may output normal data stored in the memory cell array 110 or, alternatively, one or more of the plurality of data patterns stored in the multi-purpose register 120, based on an operating mode of the semiconductor memory device 100. For example, the selection circuit 130 may output normal data if a read leveling signal R/L set to the second logic level (e.g., a lower logic level or logic "0") during a normal read operation. In an alternative example, the selection circuit 130 ma output one or more of the plurality of data patterns stored in the multi-purpose register 120 if the read leveling signal R/L is set to the first logic level (e.g., a higher logic level or logic "1") during a special read operation.

In the example embodiment of FIG. 1, the data output circuit 140 may transfer an output of the selection circuit 130 to an external entity. Although not illustrated in FIG. 1, the data output circuit 140 may include a burst data ordering part, a latch circuit and an output data buffer.

In the example embodiment of FIG. 1, the output control circuit 150 may instruct the memory cell array 110 to output read data during a normal read operation. Alternatively, during a special read operation, the output control circuit 150 may control the circuits 130 and 140 so as to block access to the memory cell array 110 and to instead authorize an output of one or more of the plurality of data patterns stored in the multi-purpose register 120 (e.g., adjusting for latency as necessary). As illustrated in FIG. 1, the output control circuit 150 may include an MRS command decoder 151, a first logic gate 153, a column command decoder 154, a second logic gate 155, a delay locked loop circuit 156 and a latency circuit 157.

In the example embodiment of FIG. 1, the MRS command decoder 151 may decode an MRS command MRS_CMD to set a mode register 152 therein. In an example, the MRS command MRS_CMD may be decoded by any combination of a chip selection signal nCS, a row address strobe signal nRAS, a column address strobe signal nCAS, a write enable signal nWE, and the like. For example, the MRS command decoder 151 may set the mode register 152 if the chip selection signal nCS is set to the second logic level (e.g., a lower logic level or logic "0"), the row address strobe signal nRAS is set to the second logic level, the column address strobe signal nCAS is set to the second logic level and the write enable signal nWE is set to the first logic level (e.g., a higher logic level or logic "1").

In the example embodiment of FIG. 1, the DDR3 SDRAM may include first through fourth mode registers. The first mode register may control a burst length (BL), a CAS latency (CL) and a test mode (TM). The second mode register may control a disabling or enabling of the delay locked loop circuit (DLL) 156. The third mode register may control refresh-related features. The fourth mode register may control an operation of the multi-purpose register 120.

FIG. 2 is a conceptual diagram illustrating the mode register 152 of FIG. 1 (e.g., the fourth mode register) according to another example embodiment of the present invention. Within the example embodiment of FIG. 2, (a) may designate an address field, and (b) may designate a set state of the mode register 152 according to the address field.

In the example embodiment of FIG. 2, the mode register 152 may control a normal read operation or a special read operation according to a value of an address A2. If the address A2 is set to the second logic level (e.g., a lower logic level or logic "0"), the normal read operation may be performed. Thus, normal data may be output from the memory cell array 110. In an alternative example, if the address A2 is set to the first logic level (e.g., a higher logic level or logic "1"), the special read operation may be performed. Thus, one or more of the plurality of data patterns, stored within the multi-purpose register 120 of FIG. 1, may be output.

In the example embodiment of FIG. 2, addresses A0 and A1 may be indicate a location of the multi-purpose register 120. In an example, assume that the multi-purpose register 120 includes four registers and that each of the four registers stores 8-bit data. In this example, the first to fourth registers may be determined by the addresses A1A0 of '00', '01', '10' and '11', respectively. Accordingly, if A2='1', A1='0', and A0='0', an 8-bit data pattern may be output as stored within the first register of the multi-purpose register 120.

FIG. 3 illustrates operating modes for the semiconductor memory device 100 of FIG. 1 based on a mode register set (MRS) as illustrated in FIG. 2 according to another example embodiment of the present invention. In an example, a normal read operation may be performed if an address A2 is '0', and a special read operation may be performed if the address A2 is '1'. Different of the data patterns stored in the multi-purpose register 120 may be outputted based on addresses A1 and A0. For example, in the example embodiment of FIG. 3, if A1='0' and A0='0', a read leveling data pattern for performing a read leveling operation may be output.

Returning to the example embodiment of FIG. 1, the MRS command decoder 151 may decode an MRS command MRS_CMD to set the mode register 152. The MRS command decoder 151 may activate (e.g., set to the first logic level) a corresponding register of the multi-purpose register 120 based on a value of the mode register 152. The MRS command decoder 151 may generate a read leveling signal R/L if an address field A2 of the mode register 152 is '1'. The read leveling signal R/L may be supplied to the selection circuit 130 and the second logic gate 155.

In the example embodiment of FIG. 1, the first logic gate 153 may generate the enable signal EN in response to the active signal ACT and the read leveling signal R/L. Herein, the active signal ACT may be generated during the normal read operation, and the read leveling signal R/L may be generated during the special read operation. The first logic gate 153 may supply the enable signal EN to the column command decoder 154 and the delay locked loop circuit 156.

In the example embodiment of FIG. 1, the column command decoder 154 may operate responsive to the enable signal EN, and may decode the read command RD_CMD to generate the read signal RD. Herein, the read command RD_CMD may be defined by a combination of the chip enable signal nCS, the row address strobe signal nRAS, the column address strobe signal nCAS, and the write enable signal nWE. For example, the command decoder 154 may generate (e.g., activate) the read signal RD if the chip selection signal nCS is set to the second logic level (e.g., a lower logic level or logic "0"), the row address strobe signal nRAS is set to the first logic level (e.g., a higher logic level or logic "1"), the column address strobe signal nCAS is set to the second logic level, and the write enable signal nWE is set to the first logic level (e.g., a higher logic level or logic "1"). The read signal RD may be supplied to the second logic gate 155 and the latency circuit 157. In an example, the read signal RD may be generated during both the normal read operation and also the special read operation.

In the example embodiment of FIG. 1, the second logic gate 155 may disable a column selection line CSL in response to the read leveling signal R/D. The second logic gate 155 may include an inverter INV and an AND gate. The inverter INV may receive the read leveling signal R/L, and the AND gate may receive the read signal R/D and an output of the inverter INV. The second logic gate 155 may enable the column selection line during the normal read operation, and may disable the column selection line CSL during the special read operation.

In the example embodiment of FIG. 1, the delay locked loop circuit 156 may operate responsive to the enable signal EN and may generate the clock signal CLK. The latency circuit 157 may operate responsive to the read signal RD and may generate a control signal CDQ such that an output of the selection circuit 130 may conform to a latency of the clock signal CLK and the mode register 152. The control signal CDQ may be supplied to the data output circuit 140.

In the example embodiment of FIG. 1, the semiconductor memory device 100 may perform one of the normal read operation and the special read operation based on a value of the mode register 152. The semiconductor memory device 100 may output one or more data patterns, stored within the multi-purpose register 120, based on the MRS command MRS_CMD (e.g., without the active command ACT_CMD) during the special read operation. Further, the semiconductor memory device 100 may generate the read leveling signal R/L so as to disable the column selection line CSL during the special read operation. The semiconductor memory device 100 may output data so as to be synchronized with the clock signal CLK (e.g., latency-matching with the clock signal CLK).

Figure 4:
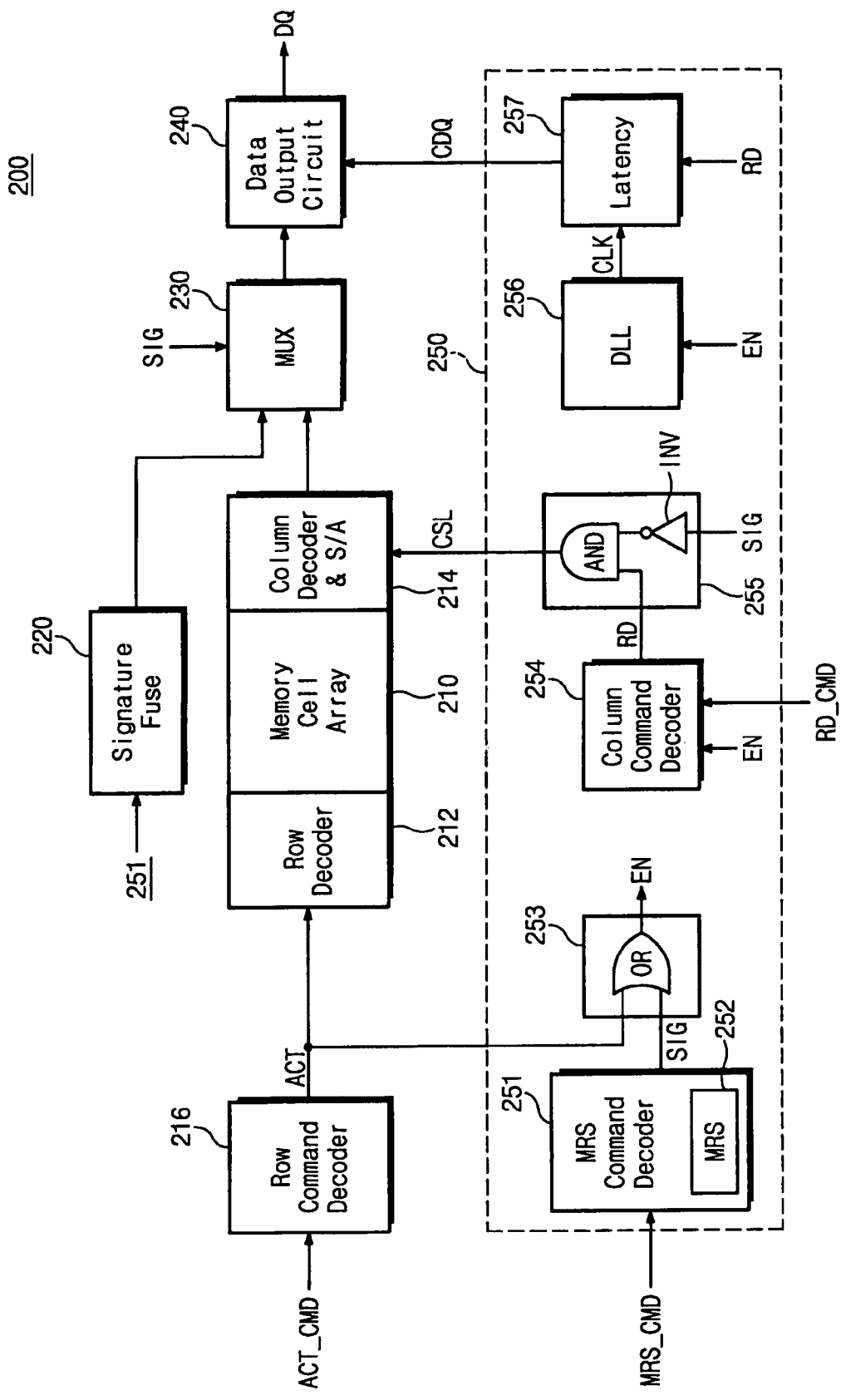
FIG. 4 is a block diagram illustrating a semiconductor memory device according to another example embodiment of the present invention.

FIG. 4 is a block diagram illustrating a semiconductor memory device 200 according to another example embodiment of the present invention. In the example embodiment of FIG. 4, the semiconductor memory device 200 may include a memory cell array 210, a signature fuse circuit 220, a selection circuit 230, a data output circuit 240 and an output control circuit 250. The example embodiment of FIG. 4 may include certain elements in common with the example embodiment of FIG. 1, and, accordingly, a further description of such common elements has been omitted for the sake of brevity.

In the example embodiment of FIG. 4, the signature fuse circuit 220 may be configured to store data patterns (e.g., die position information of a fabricated wafer, lot number information, etc.). The semiconductor memory device 200 may generate a signature signal SIG for outputting data patterns in the signature fuse circuit 220 by decoding the MRS command MRS_CMD without the active command ACT_CMD during the special operation. The output control circuit 250 may disable (e.g., transition to the second logic level) the column selection signal CSL in response to the signature signal SIG. The output of the selection circuit 230 may be configured to conform with, or synchronize with, the clock signal CLK (e.g., in terms of latency). In other respects, the semiconductor memory device 200 illustrated in FIG. 4 may operate in a manner similar to the semiconductor memory device 100 as described above with respect to FIGS. 1 through 3.

In another example embodiment of the present invention, a semiconductor memory device reading "special" data patterns stored therein may reduce a duration and power consumption allocated to "normal" data retrieval (e.g., which is not required during the special data operation). Thus, a speed of the semiconductor memory device may be increased and a current consumption of the semiconductor memory device may be reduced by avoiding or reducing access to the memory cell array.

Example embodiments of the present invention being thus described, it will be obvious that the same may be varied in many ways. For example, the first and second logic levels are above-described as corresponding to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device, comprising:
   a memory cell array configured to store data;
   a multi-purpose register configured to store a data pattern;
   a data output circuit configured to output the stored data during a first output mode and output the stored data pattern during a second output mode; and
   a mode register configured to set the first or second output mode according to a logic level of a portion of a content of the mode register.

2. The semiconductor memory device of claim 1, further comprising:
   an output control circuit including the mode register, wherein the output control circuit is configured to control transfer of the stored data in the memory cell array such that the stored data is not transferred to the data output circuit during the second output mode.

3. The semiconductor memory device of claim 1, wherein the data pattern is output for timing calibration.

4. The semiconductor memory device of claim 1, further comprising:
   a selection circuit configured to electrically connect the data output circuit with the memory cell array during the first output mode and electrically connect the data output circuit with the multi-purpose register during the second output mode.

5. The semiconductor memory device of claim 1, wherein the multi-purpose register includes four register portions, and wherein at least one of the four register portions is selected to output data according to an address input.

6. The semiconductor memory device of claim 5, wherein at least one another register portion of the four register portions is selected according to first and second bit of the address input.

7. The semiconductor memory device of claim 5, wherein at least one another register portion of the four register portions stores the data pattern for timing calibration.

8. The semiconductor memory device of claim 1, wherein the mode register is further configured to select the second output mode when a third bit of the address input is logic high.

9. The semiconductor memory device of claim 1, wherein the mode register is further configured to select the first output mode when a third bit of the address input is logic low.

10. The semiconductor memory device of claim 1, wherein the mode register includes:
   a first register portion configured to control burst length, read burst type, column address strobe signal, CAS latency and test mode;
   a second register portion configured to control disabling or enabling of a delay locked loop;
   a third register portion configured to control refresh-related features; and
   a fourth register portion configured to control the multi-purpose register.

11. The semiconductor memory device of claim 1, wherein the mode register is further configured to select the second output mode when a chip selection signal, a row address strobe signal and a column address strobe signal is enabled and a write enable signal is disabled.

12. A semiconductor memory device comprising:
   a memory cell array configured to store data;
   a multi-purpose register configured to store a data pattern for timing calibration;
   a mode register set command decoder configured to include a mode register and generate a read leveling signal; and
   a selection circuit configured to electrically connect the multi-purpose register and output the stored data pattern in response to the read leveling signal.

13. A semiconductor memory device, comprising:
   a memory cell array configured to store data;
   a multi-purpose register configured to store a data pattern for timing calibration;
   a data output circuit configured to output the stored data during a first output mode and output the stored data pattern during a second output mode;
   a mode register configured to set the first or second output mode according to a logic level of a portion of a content of the mode register;
   a mode register set command decoder configured to include the mode register and generate a read leveling signal;
   a selection circuit configured to electrically connect the multi-purpose register with the data output circuit and output the stored data pattern in response to the read leveling signal;
   a delay locked loop configured to generate a clock signal; and
   a latency circuit configured to control the data output circuit to control data output from the data output circuit to a latency of the clock signal.

14. A method of reading data from a semiconductor memory device, the method comprising:
   setting a mode register to set a first read mode or a second read mode;
   reading data from a memory cell array during the first read mode; and
   reading a data pattern from a multi-purpose register for timing calibration during the second read mode.

15. The method of claim 14, wherein the setting the mode register includes:
   setting a mode register set command; and
   setting an address of the mode register.

16. The method of claim 15, wherein the setting the mode register set command includes:
   enabling a chip selection signal, a row address strobe signal, a column address strobe signal; and
   disabling a write enable signal.

17. The method of claim 15, wherein the setting the address includes:
   setting a third bit of the address of the mode register to logic high.

* * * * *